(12) United States Patent
Kim et al.

(10) Patent No.: US 11,646,482 B2
(45) Date of Patent: May 9, 2023

(54) ELECTRONIC DEVICE AND METHOD OF FABRICATING THE SAME

(71) Applicant: SAMSUNG DISPLAY CO., LTD., Yongin-si (KR)

(72) Inventors: Jae-Kyoung Kim, Hwaseong-si (KR); Kiseo Kim, Yongin-si (KR); WonSang Park, Yongin-si (KR); Bonghyun You, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 112 days.

(21) Appl. No.: 17/031,047

(22) Filed: Sep. 24, 2020

(65) Prior Publication Data

US 2021/0249755 A1 Aug. 12, 2021

(30) Foreign Application Priority Data

Feb. 10, 2020 (KR) ........................ 10-2020-0015331

(51) Int. Cl.
*G06F 3/041* (2006.01)
*H01Q 1/14* (2006.01)
*H01Q 5/307* (2015.01)

(52) U.S. Cl.
CPC ............... *H01Q 1/14* (2013.01); *G06F 3/041* (2013.01); *H01Q 5/307* (2015.01); *G06F 2203/04102* (2013.01)

(58) Field of Classification Search
CPC ............. G06F 2203/04103; G06F 2203/04105
See application file for complete search history.

(56) References Cited

U.S. PATENT DOCUMENTS 10,381,750 B2   8/2019  Jung et al.
2004/0032377 A1*  2/2004  Forster ............ G06K 19/07786
                                               343/793

(Continued)

FOREIGN PATENT DOCUMENTS

CN          103367880       10/2013
KR       10-2017-0100972    9/2017

(Continued)

OTHER PUBLICATIONS

Xie, et al., "Materials and Structures for Stretchable Energy Storage and Conversion Devices", Advanced Materials, Jun. 2014, pp. 3592-3618.

(Continued)

*Primary Examiner* — Md Saiful A Siddiqui
(74) *Attorney, Agent, or Firm* — F. Chau & Associates, LLC

(57) ABSTRACT

The present disclosure presents an electronic device. The electronic device may include a display panel, an input sensor, a first antenna, and a second antenna. The display panel includes a display region and a non-display region adjacent to the display region. The input sensor is disposed on the display panel and overlapped with a first region of the display region. The first antenna and a second antenna are disposed on the display panel and are overlapped with a second region of the display region, and each of which includes a stretchable pattern. A first distance between opposite ends of the stretchable pattern of the first antenna may be different from a second distance between opposite ends of the stretchable pattern of the second antenna. The inventive concept may provide an electronic device including a stretchable antenna.

18 Claims, 18 Drawing Sheets

(56) References Cited

U.S. PATENT DOCUMENTS

| | | | | |
|---|---|---|---|---|
| 2004/0192082 | A1* | 9/2004 | Wagner | H05K 1/11 |
| | | | | 439/67 |
| 2010/0321325 | A1* | 12/2010 | Springer | H01Q 1/2266 |
| | | | | 345/173 |
| 2014/0104157 | A1* | 4/2014 | Burns | H01Q 1/243 |
| | | | | 343/702 |
| 2015/0380355 | A1* | 12/2015 | Rogers | H01L 23/5387 |
| | | | | 257/773 |
| 2017/0181277 | A1* | 6/2017 | Tomita | H05K 1/0283 |
| 2017/0250460 | A1 | 8/2017 | Shin et al. | |
| 2018/0046221 | A1* | 2/2018 | Choi | G02B 26/0825 |
| 2019/0036208 | A1* | 1/2019 | Yamagishi | G06K 7/10297 |
| 2019/0361549 | A1* | 11/2019 | Gu | G06F 3/044 |

FOREIGN PATENT DOCUMENTS

| | | |
|---|---|---|
| KR | 10-2019-0019802 | 2/2019 |
| KR | 10-1971490 | 4/2019 |

OTHER PUBLICATIONS

Yan, et al., "Highly Stretchable and Shape-Controllable Three-Dimensional Antenna Fabricated by "Cut-Transfer-Release" Method", Scientific Reports, Feb. 13, 2017, pp. 1-7.

* cited by examiner

ELECTRONIC DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2020-0015331, filed on Feb. 10, 2020, in the Korean Intellectual Property Office, the contents of which are incorporated by reference herein in their entirety.

BACKGROUND OF THE INVENTION

The present disclosure relates to an electronic device and a method of fabricating the same, and in particular, an electronic device with increased antenna efficiency and a method of fabricating the same.

Electronic devices are may be used to convey information to a user or between multiple users. Smartphones, computers, televisions, and navigation units are examples of electronic devices. Electronic devices contain electronic modules such as an antenna, a camera, or a battery.

Demand for thinner, lighter, and more convenient electronic devices has risen, leading to a reduction in the size of electronic devices. Accordingly, the size of the electronic modules inside the electronic devices then has also be reduced. Additionally, as the functions and specifications of electronic device are increased, the quantity of electronic or antenna modules in the electronic device may also be increased, which also leads to smaller modules.

As a result, there is a need in the art for a design and method of reducing the size of electronic modules while maintaining the effectiveness of the modules.

SUMMARY

An embodiment of the inventive concept provides an electronic device including a stretchable antenna and a method of fabricating the same.

According to an embodiment of the inventive concept, an electronic device may include a display panel including a display region and a non-display region adjacent to the display region; and a first antenna and a second antenna, which are disposed on the display panel and are overlapped with the display region, wherein each of the first antenna and the second antenna includes a stretchable pattern, wherein a first distance between opposite ends of the stretchable pattern of the first antenna is different from a second distance between opposite ends of the stretchable pattern of the second antenna.

In an embodiment, the second region may correspond to an edge of the display region enclosing the first region. In an embodiment, the first antenna and the second antenna may provide a first frequency band and a second frequency band, respectively, which are different from each other. When the first distance is larger than the second distance, the first frequency band may be smaller than the second frequency band, and when the first distance is smaller than the second distance, the first frequency band may be larger than the second frequency band.

In an embodiment, the first antenna may be spaced apart from the second antenna, when viewed in a plan view. In an embodiment, the first antenna and the second antenna may have a mesh shape, the stretchable pattern may include a plurality of stretchable patterns, and the mesh shape may be defined by the plurality of stretchable patterns. In an embodiment, the first antenna and the second antenna may further include fastening patterns, which are used to fasten opposite ends of at least two stretchable patterns of the plurality of stretchable patterns.

In an embodiment, the number of the stretchable patterns of the first antenna may be equal to the number of the stretchable patterns of the second antenna. In an embodiment, the stretchable pattern may include a curved-line portion including a plurality of curved portions, and the plurality of curved portions may have the same width. In an embodiment, a first width of each of the curved portions of the stretchable pattern of the first antenna may be different from a second width of each of the curved portions of the stretchable pattern of the second antenna.

In an embodiment, a stretched length of the curved-line portion of the stretchable pattern of the first antenna may be equal to a stretched length of the curved-line portion of the stretchable pattern of the second antenna. In an embodiment, the stretchable pattern may have a curved shape, which allows the stretchable pattern to have a protruding shape in a thickness direction of the display panel. In an embodiment, each of the first antenna and the second antenna may further include a base substrate supporting the stretchable pattern.

In an embodiment, the input sensor may include a first insulating layer, a first sensing layer disposed on the first insulating layer, a second insulating layer covering the first sensing layer, and a second sensing layer disposed on the second insulating layer. The second sensing layer may include a plurality of sensor units, which are spaced apart from the first and second antennas in a thickness direction.

According to an embodiment of the inventive concept, an electronic device may include a display panel including a display region and a non-display region adjacent to the display region, an input sensor disposed on the display panel and overlapped with a first region of the display region, and a first antenna and a second antenna, which are disposed on the display panel and are overlapped with a second region of the display region, wherein each of the first antenna and the second antenna includes a mesh pattern. The mesh pattern of the first antenna may include a first pattern portion with a first size, and the mesh pattern of the second antenna may include a second pattern portion with a second size different from the first size.

In an embodiment, each of the first pattern portion and the second pattern portion may include a plurality of stretchable patterns, each of which has a curved-line portion. In an embodiment, the curved-line portion may include a plurality of curved portions, and the number of the curved portions of the first pattern portion may be equal to the number of the curved portions of the second pattern portion.

In an embodiment, a first width of each of the curved portions of the first pattern portion may be smaller than a second width of each of the curved portions of the second pattern portion. In an embodiment, the electronic device may further include a base substrate, which supports both of the first and second antennas and is stretchable.

According to an embodiment of the inventive concept, a method of fabricating an electronic device may include providing a display panel including a display region, in which a first region and a second region enclosing the first region are defined, and a non-display region, which is adjacent to the display region; attaching a first stretchable antenna, which is stretchable and has a first size, to the second region of the display panel; stretching a second stretchable antenna from the first size to a second size; and attaching the second stretchable antenna to the second region of the display panel.

In an embodiment, the first stretchable antenna and the second stretchable antenna may include a first stretchable pattern and a second stretchable pattern, respectively. The forming of the second stretchable antenna may include stretching the first stretchable pattern to form the second stretchable pattern.

According to another embodiment, an electronic device may include a display panel including a display region and a non-display region adjacent to the display region; a first antenna in a border region of the display region, wherein the first antenna comprises a stretchable pattern having a first size; and a second antenna in the border region, wherein the second antenna comprises the stretchable pattern stretched to a second size different from the first size.

In an embodiment, the electronic device further comprises a third antenna in the border region, wherein the third antenna comprises the stretchable pattern stretched to a third size different from the first size and the second size. In an embodiment, the first antenna and the second antenna each comprise a mesh pattern having a same number of holes. In an embodiment, the first antenna and the second antenna are located within a bendable region of the display panel which is spaced apart from a non-bendable region of the display panel that includes an input sensor.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
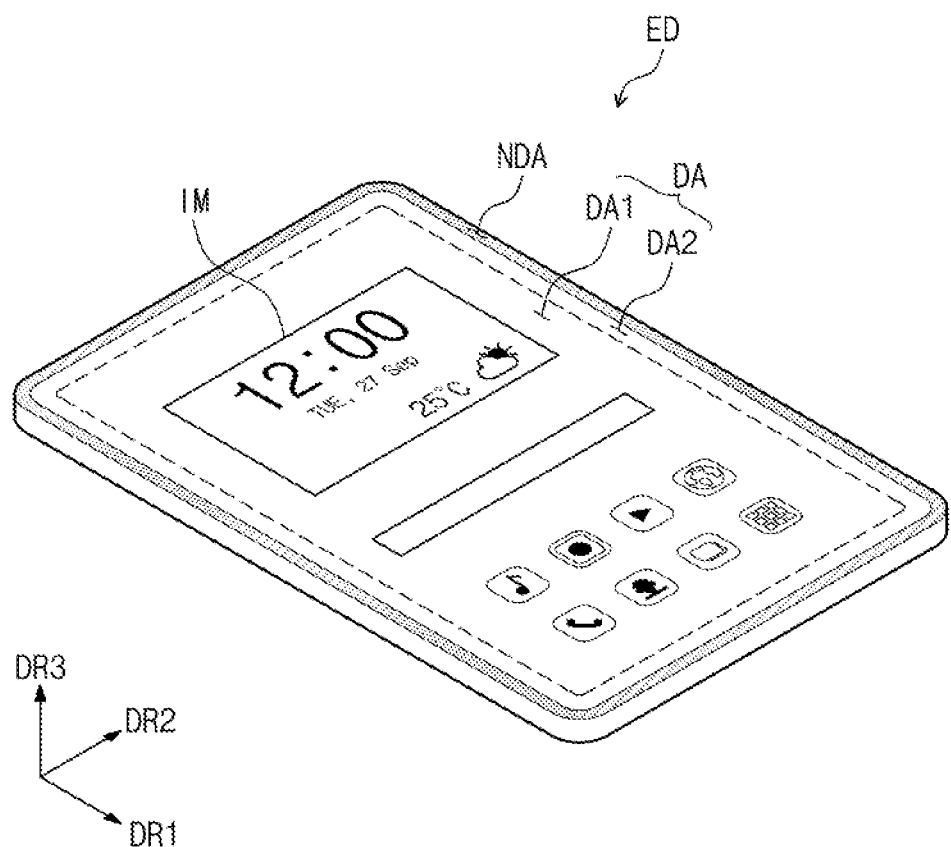
FIG. 1 is a perspective view illustrating an electronic device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure relates generally to an electronic device with a display panel. More particularly, the disclosure relates to a display panel with a stretchable antenna. According to embodiments of the present disclosure may include one or more antennas formed on the side of a display, rather than the front of the display. This may mitigate image quality problems and signal interference. In some embodiments, multiple different antennas configured for multiple bandwidths are disposed on the side of the display. Gaps may be maintained between the antennas to minimize field interference in different areas.

Embodiments of the present disclosure provide an electronic device with a display panel, an input sensor, a first antenna, and a second antenna. The display panel includes a display region and a non-display region adjacent to the display region. The input sensor is disposed on the display panel and overlapped with a first region of the display region. The first antenna and a second antenna are disposed on the display panel and are overlapped with a second region of the display region.

Each antenna includes a stretchable pattern. A first distance between opposite ends of the stretchable pattern of the first antenna may be different from a second distance between opposite ends of the stretchable pattern of the second antenna. Accordingly, the present disclosure provides a stretchable antenna, and when applied to a stretchable or foldable device, the antenna size can change according to change in device shape. As a result, the antenna maintains desired frequency characteristics.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements. Therefore, the element's description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Therefore, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Therefore, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Therefore, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as with a meaning consistent with the terms meaning in the context of the relevant art and will not be interpreted in an idealized or overly formal sense unless expressly so defined herein.

FIG. 1 is a perspective view illustrating an electronic device ED according to an embodiment of the inventive concept. As shown in FIG. 1, the electronic device ED may include a display surface, which is used to display an image IM. The display surface may be parallel to a plane defined by a first direction axis DR1 and a second direction axis DR2. A direction normal to the display surface (or a thickness direction of the electronic device ED) will be referred to as a third direction axis DR3.

In the following description, the third direction axis DR3 may be used to differentiate a front or a top surface of each element or a unit from a back or a bottom surface. However, directions indicated by the first to third direction axes DR1, DR2, and DR3 may be just an example. Hereinafter, first to third directions may be directions indicated by the first to third direction axes DR1, DR2, and DR3, respectively, and will be identified with the same reference numbers.

In FIG. 1, the electronic device ED is illustrated to have a flat display surface, but the inventive concept is not limited thereto. The display surface of the electronic device ED may have a curved or three-dimensional shape. In the case where the electronic device ED has the three-dimensional display surface, the display surface may include a plurality of display regions oriented in different directions. For example, the display surface of the electronic device ED may be shaped like a surface of a polygonal pillar.

The electronic device ED, according to the present embodiment, may be a rigid-type display device, but the inventive concept is not limited to this example. For example, in an embodiment, the electronic device ED may be a flexible-type electronic device ED. In the present embodiment, the electronic device ED, which can be used as a cellphone terminal, is exemplarily illustrated. Although not shown, electronic modules, a camera module, a power module, etc., which are mounted on a mainboard, along with the electronic device ED, may be provided in a bracket or case to constitute a cellphone terminal. The electronic device ED may be used for large-sized electronic devices (e.g., television sets and monitors) or for tablets, car navigation systems, game machines, and smartwatches.

As shown in FIG. 1, the display surface may include an image region DA and a bezel region NDA. The image region DS may be used to display the image IM. The bezel region NDA may be disposed adjacent to the image region DA. The bezel region NDA may not be used to display an image. In an embodiment, the image region of the display surface may correspond to a display region, and the display region may include a first region DA1 and a second region DA2. For example, a center of the display region may overlap the first region DA1. The second region DA2 may be provided at an edge of the display region enclosing the first region DA1. As an example of the image IM, icon images are shown in FIG. 1.

As shown in FIG. 1, the image region DA may have a rectangular shape. The bezel region NDA may enclose the image region DA. However, the inventive concept is not limited thereto, and the shapes of the image and bezel regions DA and NDA may be variously changed in a mutually influential manner.

FIGS. 2A to 2D are sectional views, each of which illustrates the electronic device ED according to an embodiment of the inventive concept. FIGS. 2A to 2D illustrate vertical sections, each of which is defined by the second and third direction axes DR2 and DR3. In FIGS. 2A to 2D, the electronic device ED is illustrated in a simplified manner to describe a stacking structure of functional panels and/or functional units therein.

In an embodiment, the electronic device ED may include a display panel, an input sensor, an anti-reflection unit, and a window. At least some of the display panel, the input sensor, the anti-reflection unit, and the window may be successively formed by a successive process or may be bonded to each other by an adhesive member. FIGS. 2A to 2D illustrate examples in which an optically clear adhesive OCA is used as the adhesive member. In various embodiments to be described below, the adhesive member may be a typical adhesive material or a typical gluing agent. In certain embodiments, the anti-reflection unit and the window may be replaced with other unit or may be omitted.

In FIGS. 2A to 2D, if an element (e.g., the input sensor, the anti-reflection unit, or the window) is formed on another element by a successive process, the element will be expressed using a term "layer". If an element (e.g., the input sensor, the anti-reflection unit, or the window) is combined to another element by an adhesive member, the element will be expressed using a term "panel". The element expressed using the term "panel" may include a base layer (e.g., a synthetic resin film, a composite film, or a glass substrate) providing a base surface, but the element expressed using the term "layer" may not have the base layer. In other words, the element expressed using the term "layer" may be disposed on a base surface provided by another element or unit.

The input sensor, the anti-reflection unit, and the window may be referred to as an input-sensing panel ISP, an anti-reflection panel RPP, and a window panel WP, respectively, or may be referred to as an input-sensing layer ISL, an anti-reflection layer RPL, and a window layer WL, respectively, according to the presence or absence of the base layer.

Figure 2A:
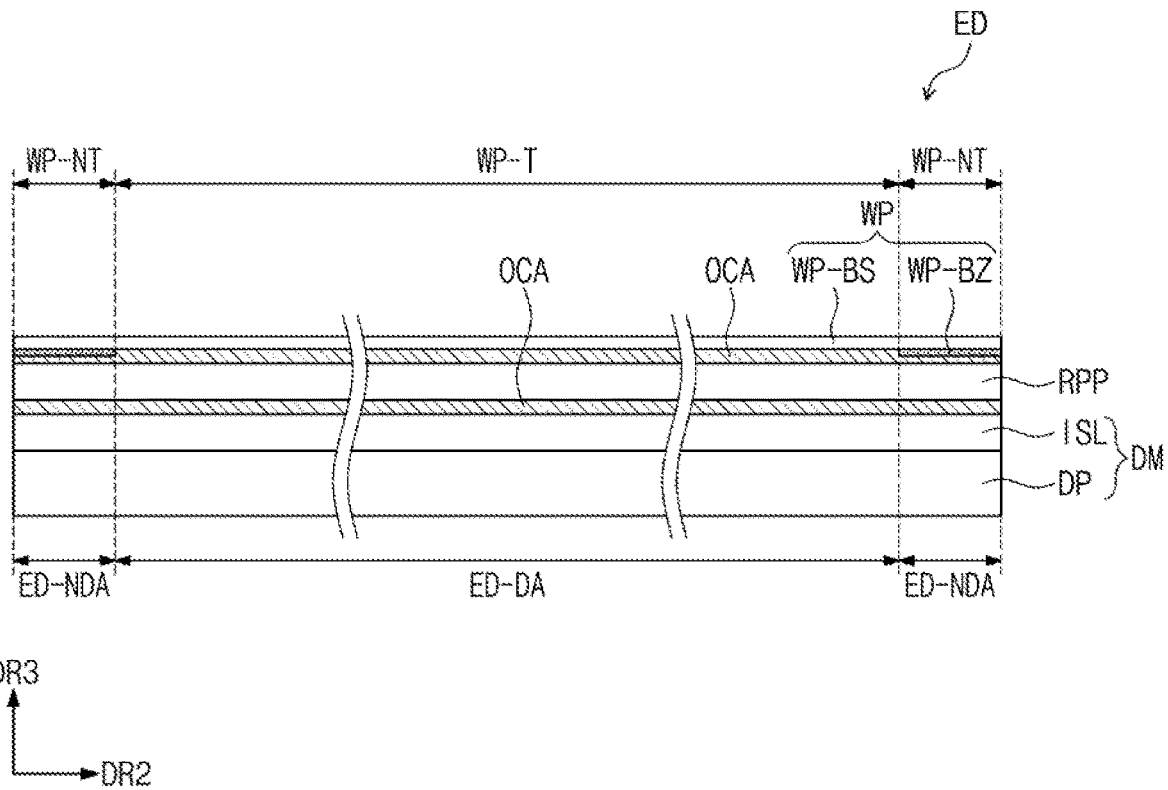
FIGS. 2A to 2D are sectional views, each of which illustrates an electronic device according to an embodiment of the inventive concept.

As shown in FIG. 2A, the electronic device ED may include a display panel DP, the input-sensing layer ISL, the anti-reflection panel RPP, and the window panel WP. The input-sensing layer ISL may be directly disposed on the display panel DP. In the specification, the expression "an element B may be directly disposed on an element A" may mean that an adhesive layer or an adhesive member is not disposed between the elements A and B or that the element B is in direct contact with the element A. After the formation of the element A, the element B may be formed on a base surface, which is provided by the element A, through a successive process.

The display panel DP and the input-sensing layer ISL, which is directly disposed on the display panel DP, may be defined as a display module DM. An optically clear adhesive OCA may be provided between the display module DM and the anti-reflection panel RPP and between the anti-reflection panel RPP and the window panel WP.

The display panel DP may generate an image to be displayed to the outside, and the input-sensing layer ISL may be configured to obtain coordinate information regarding an external input (e.g., touch event). Although not shown, the display module DM may further include a protection member disposed on the bottom surface of the display panel DP. The protection member and the display panel DP may be combined to each other by an adhesive member. The electronic devices ED, which will be described with reference to FIGS. 2B to 2D, may further include a protection member.

In an embodiment, the display panel DP may be a light-emitting type display panel, but the inventive concept is not limited to a specific type of the display panel DP. For example, the display panel DP may be an organic light-emitting display panel or a quantum dot light-emitting display panel. An emission layer of the organic light-emitting display panel may be formed of or include an organic luminescent material. An emission layer of the quantum dot light-emitting display panel may include quantum dots and/or quantum rods. For the sake of simplicity, the description that follows will refer to an example in which the display panel DP is the organic light-emitting display panel.

The anti-reflection panel RPP may reduce a reflectance of an external light incident from an outer space to the window panel WP. In an embodiment, the anti-reflection panel RPP may include a phase retarder and a polarizer. The phase retarder may be of a film type or a liquid crystal coating type and may include a $\lambda/2$ phase retarder and/or a $\lambda/4$ phase retarder, but the inventive concept is not limited to a specific type of phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection film may be defined as a base layer of the anti-reflection panel RPP.

In an embodiment, the anti-reflection panel RPP may include color filters. The color filters may be arranged in a specific manner. The arrangement of the color filters may be determined in consideration of the colors of lights emitted from the pixels in the display panel DP. The anti-reflection panel RPP may further include a black matrix adjacent to the color filters.

In an embodiment, the anti-reflection panel RPP may include an interference structure. For example, the interference structure may include a first reflection layer and a second reflection layer, which are disposed on different layers. The first reflection layer and the second reflection layer may be configured to allow a first reflection light and a second reflection light, which are respectively reflected by them, to interfere with each other, and this may reduce the reflectance of the external light.

In an embodiment, the window panel WP may include a base layer WP-BS and a light-blocking pattern WP-BZ. The base layer WP-BS may include a glass substrate and/or a synthetic resin film. The base layer WP-BS may not be limited to a single-layered structure. The base layer WP-BS may include two or more films that are bonded to each other by an adhesive member.

The base layer WP-BS may overlap the light-blocking pattern WP-BZ. The light-blocking pattern WP-BZ may be disposed on a rear surface of the base layer WP-BS and may be disposed in a light-blocking region WP-NT of the base layer WP-BS. The light-blocking region WP-NT may substantially define a bezel region ED-NDA of the electronic device ED. A region, in which the light-blocking pattern WP-BZ is not disposed, may be defined as a transmission region WP-T of the window panel WP.

The light-blocking pattern WP-BZ may be a colored organic layer, which is formed by, for example, a coating method. Although not shown, the window panel WP may further include a functional coating layer provided on the front surface of the base layer WP-BS. The functional coating layer may include an anti-fingerprint layer, an anti-reflection layer, and a hard coating layer. In the following description of FIGS. 2B to 2D, the window panel WP and the window layer WL are illustrated in a simplified manner (e.g., without distinction of the base layer WP-BS and the light-blocking pattern WP-BZ).

Figure 2B:
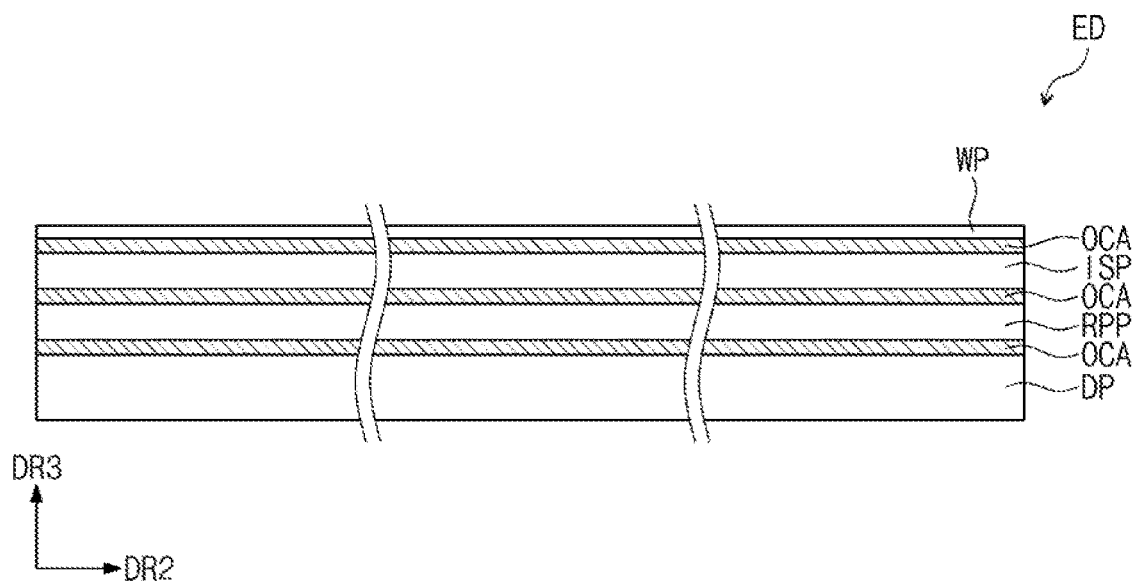
Figure 2C:
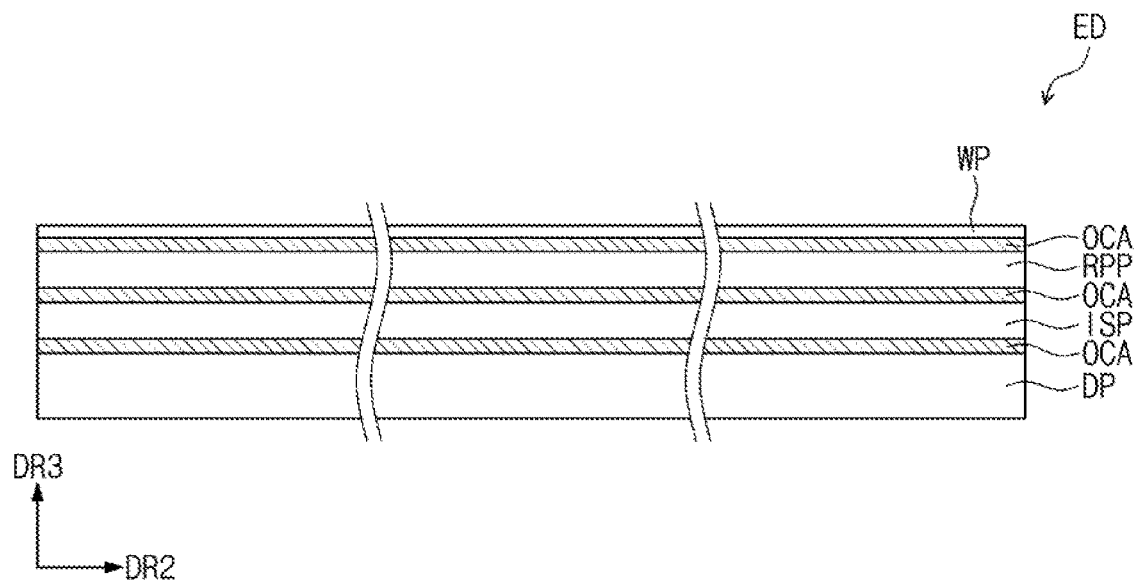

As shown in FIGS. 2B and 2C, the electronic device ED may include the display panel DP, the input-sensing panel ISP, the anti-reflection panel RPP, and the window panel WP. A stacking order of the input-sensing panel ISP and the anti-reflection panel RPP may be changed.

Figure 2D:
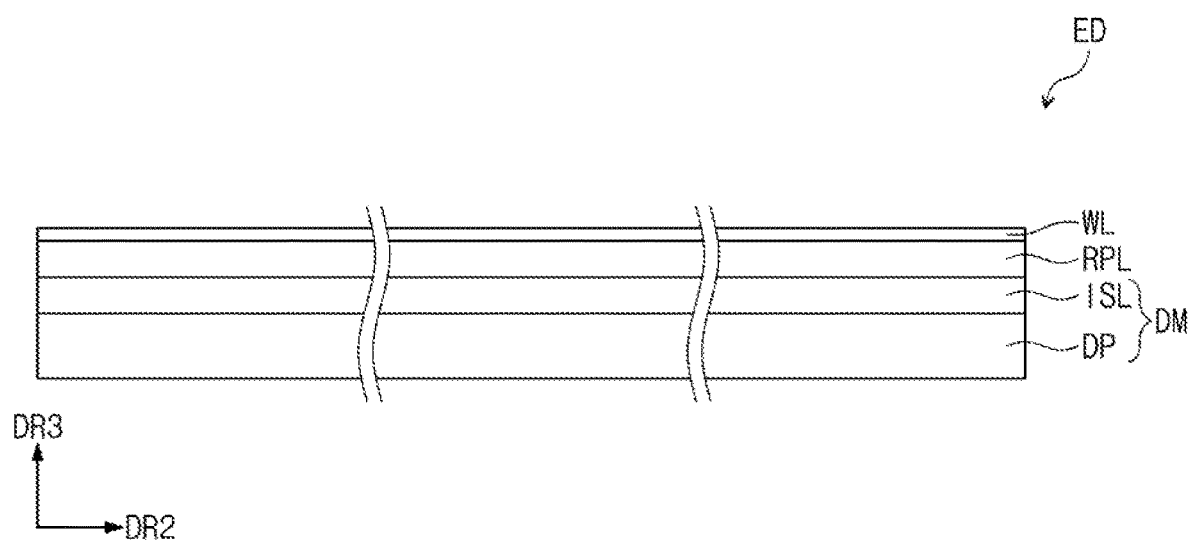

As shown in FIG. 2D, the electronic device ED may include the display panel DP, the input-sensing layer ISL, the anti-reflection layer RPL, and the window layer WL. Adhesive members may be omitted from the electronic device ED, and the input-sensing layer ISL, the anti-reflection layer RPL, and the window layer WL may be formed on a base surface, which is provided by the display panel DP, by a successive process. Stacking order of the input-sensing layer ISL and the anti-reflection layer RPL may be changed.

Figure 3A:
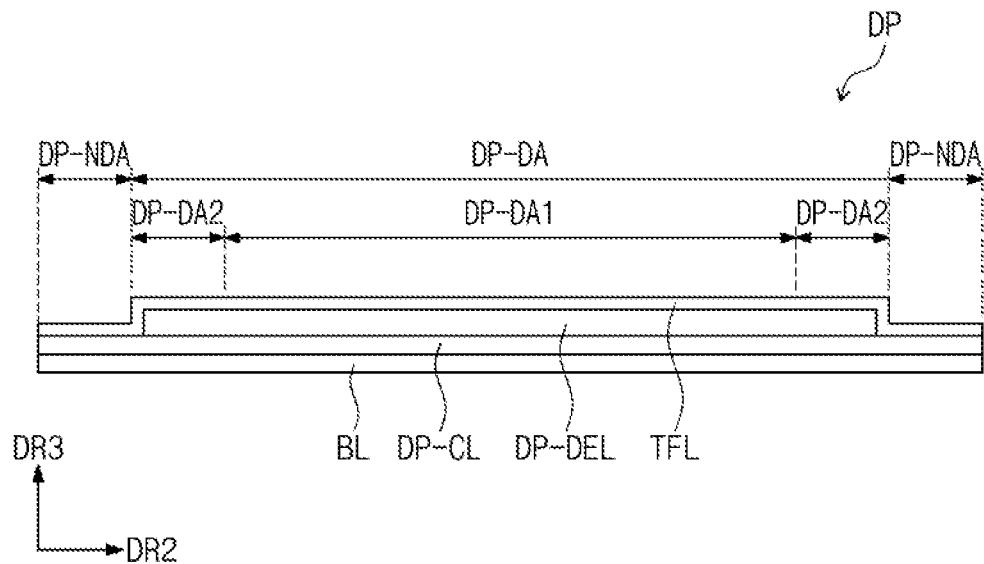
FIGS. 3A and 3B are sectional views, each of which illustrates a display panel according to an embodiment of the inventive concept.
Figure 3B:
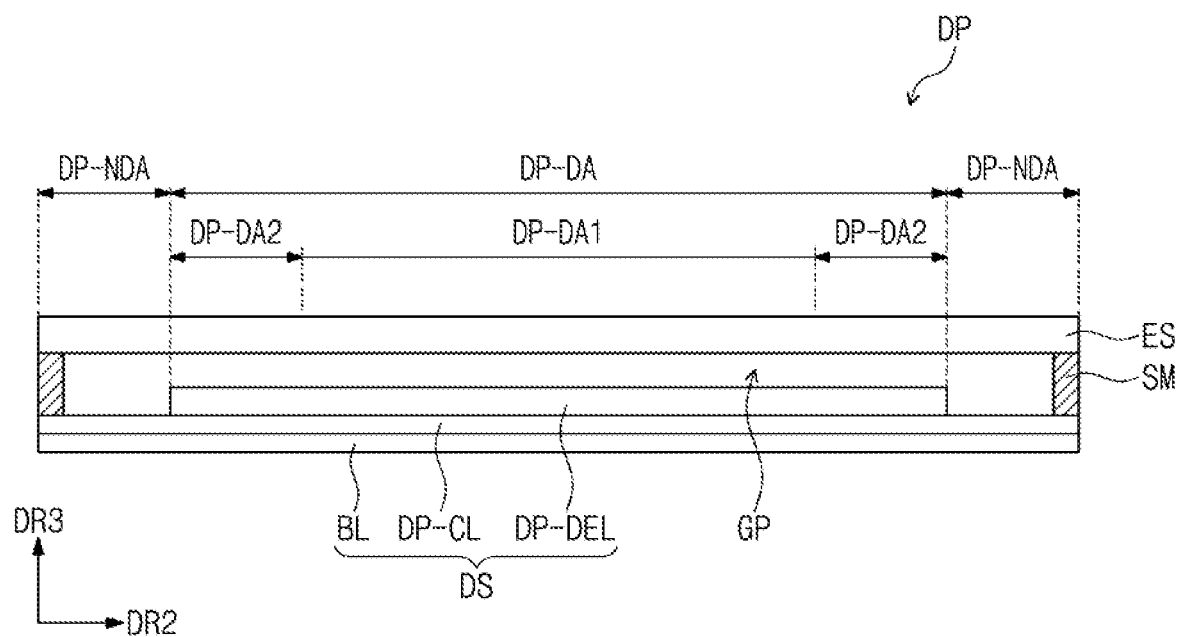

FIGS. 3A and 3B are sectional views, each of which illustrates the display panel DP according to an embodiment of the inventive concept.

As shown in FIG. 3A, the display panel DP may include a base layer BL. The display panel DP may also include a circuit device layer DP-CL, a display device layer DP-DEL, and an upper insulating layer TFL disposed on the base layer BL. A display region DP-DA and a non-display region DP-NDA, which correspond to the image region DA and the bezel region NDA of FIG. 1, may be defined in the display panel DP. Additionally or alternatively, the first region DA1 and the second region DA2 of FIG. 1 may correspond to a first region DP-DA1 and a second region DP-DA2, respectively, which are defined in the display panel DP. In the present specification, the expression "one region corresponds to another region" may mean that the two regions are overlapped with each other but are not limited to have the same area.

The base layer BL may include at least one plastic film. The base layer BL may be or include a plastic substrate, a glass substrate, a metal substrate, or a substrate made of an organic/inorganic composite material.

The circuit device layer DP-CL may include at least one intermediate insulating layer and a circuit device. The intermediate insulating layer may include at least one intermediate inorganic layer and/or at least one intermediate organic layer. The circuit device may include signal lines, pixel driving circuits, and so forth. This will be described in more detail below.

The display device layer DP-DEL may include at least organic light-emitting diodes. The display device layer DP-DEL may further include an organic layer, such as a pixel definition layer.

The upper insulating layer TFL may include a plurality of thin films. Some of the thin films may be provided to increase optical efficiency, and some of the thin films may be provided to protect the organic light-emitting diodes. The upper insulating layer TFL will be described in more detail below.

As shown in FIG. 3B, the display panel DP may include the base layer BL, the circuit device layer DP-CL, the display device layer DP-DEL, an encapsulation substrate ES, and a sealant SM, which are disposed on the base layer BL. The sealant SM may be used to combine the base layer BL to the encapsulation substrate ES. The encapsulation substrate ES may be spaced apart from the display device layer DP-DEL, with a gap GP interposed therebetween. The base layer BL and the encapsulation substrate ES may be or include a plastic substrate, a glass substrate, a metal substrate, or a substrate made of an organic/inorganic composite material. The sealant SM may include an organic adhesive member, a frit, or the like.

Figure 4:
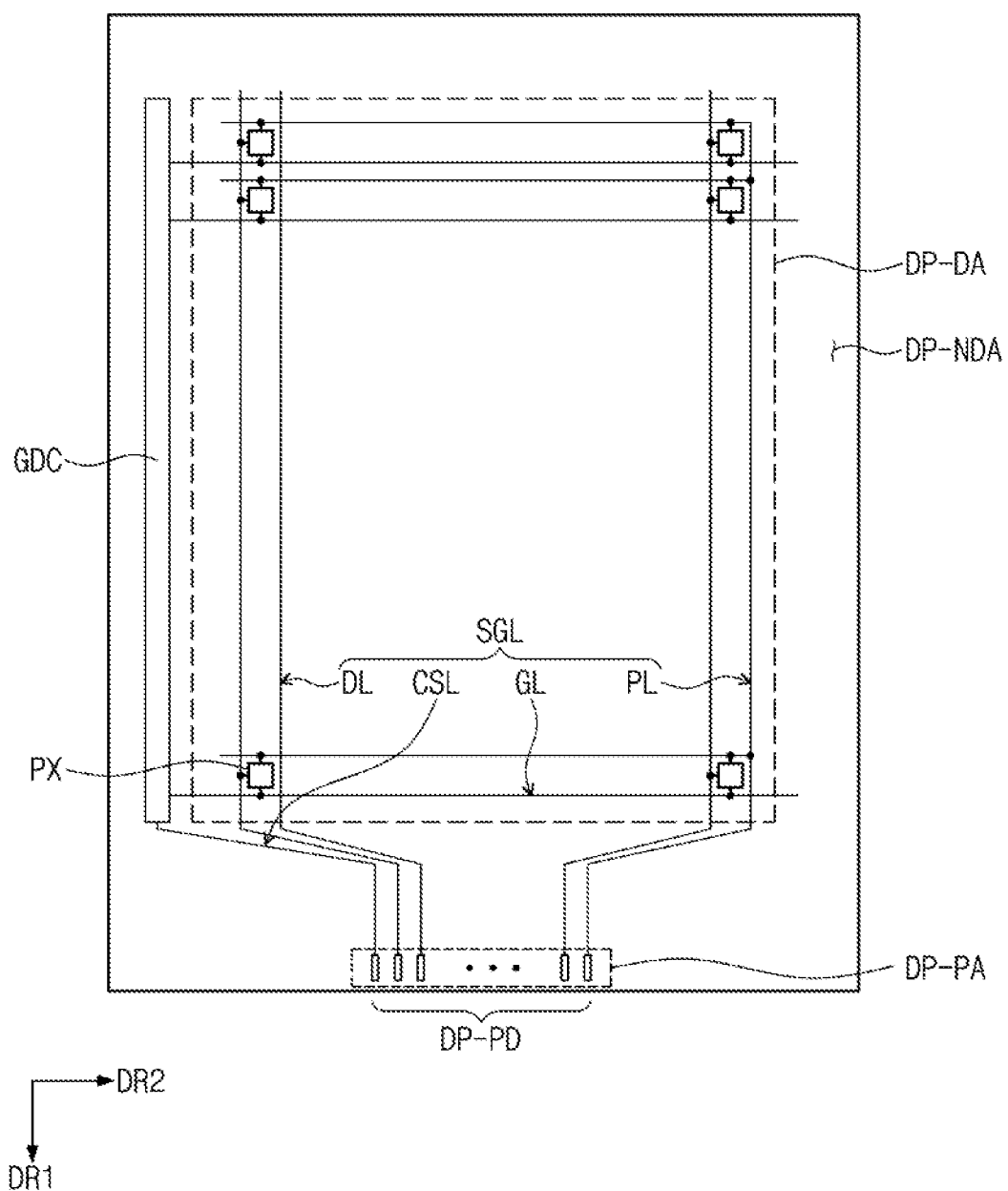
FIG. 4 is a plan view illustrating a display panel according to an embodiment of the inventive concept.
Figure 5A:
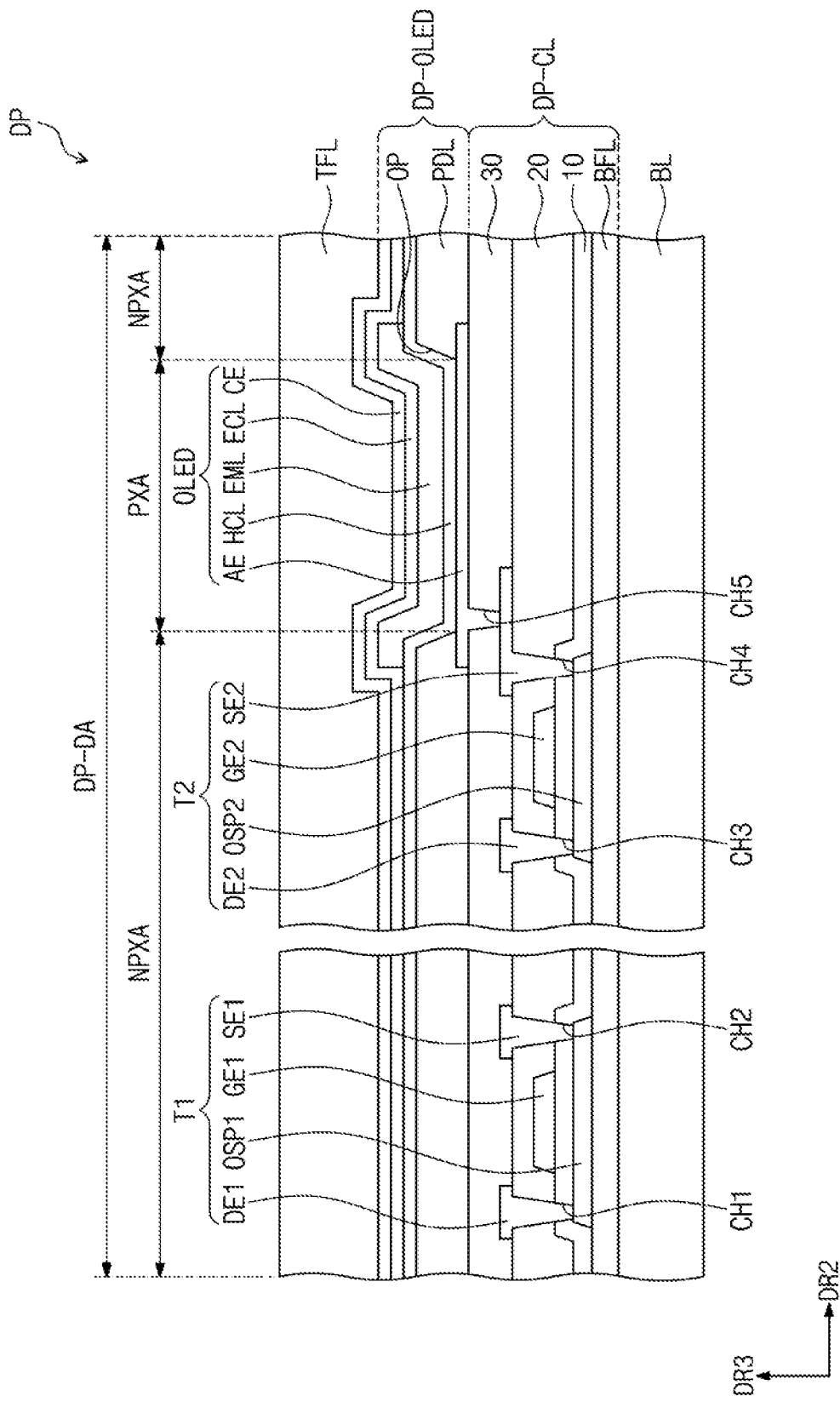
FIG. 5A is an enlarged sectional view illustrating a display panel according to an embodiment of the inventive concept.
Figure 5B:
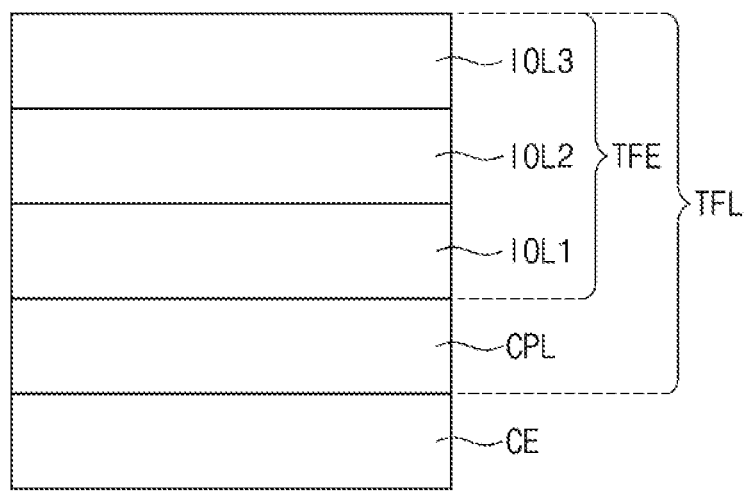
FIG. 5B is an enlarged sectional view illustrating an upper insulating layer according to an embodiment of the inventive concept.

FIG. 4 is a plan view illustrating the display panel DP according to an embodiment of the inventive concept. FIG. 5A is an enlarged sectional view illustrating the display panel DP according to an embodiment of the inventive concept. FIG. 5B is an enlarged sectional view illustrating the upper insulating layer TFL according to an embodiment of the inventive concept. The display panel DP of FIG. 5A is illustrated based on the display panel DP of FIG. 3A.

As shown in FIG. 4, the display panel DP may include a driving circuit GDC, a plurality of signal lines SGL, a plurality of signal pads DP-PD, and a plurality of pixels PX.

The display region DP-DA may be defined as a region in which the pixels PX are disposed. Each of the pixels PX may include an organic light-emitting diode and a pixel driving circuit connected thereto. The driving circuit GDC, the signal lines SGL, the signal pads DP-PD, and the pixel driving circuit may be included in the circuit device layer DP-CL shown in FIGS. 3A and 3B.

The driving circuit GDC may include a scan driving circuit. The scan driving circuit may generate a plurality of scan signals and may sequentially output the scan signals to a plurality of scan lines GL to be described below. Additionally or alternatively, the scan driving circuit may output other control signals to a driving circuit of the pixel PX.

The scan driving circuit may include a plurality of thin-film transistors that are formed by the same process as that for the driving circuit of the pixel PX (e.g., by a low-temperature polycrystalline silicon (LTPS) process or a low-temperature polycrystalline oxide (LTPO) process).

The signal lines SGL may include scan lines GL, data lines DL, a power line PL, and a control signal line CSL. Each of the scan lines GL may be connected to corresponding ones of the pixels PX. Each of the data lines DL may be connected to corresponding ones of the pixels PX. The power line PL may be connected to the pixels PX. The control signal line CSL may be used to provide control signals to the scan driving circuit.

The signal lines SGL may be overlapped with the display region DP-DA and the non-display region DP-NDA. Each of the signal lines SGL may include a pad portion and a line portion. The line portion may be overlapped with the display region DP-DA and the non-display region DP-NDA. The pad portion may be connected to an end of the line portion. The pad portion may be disposed in the non-display region DP-NDA and may be overlapped with a corresponding one of the signal pads DP-PD. A portion of the non-display region DP-NDA, on which the signal pads DP-PD are provided, will be referred to as a pad region DP-PA. The pad region DP-PA may be coupled to a circuit board (not shown).

The line portion connected to the pixel PX may constitute substantially some or all of the signal line SGL. The line portion may be connected to transistors T1 and T2 of the pixel PX (e.g., see FIG. 5A). The line portion may have a single or multi-layered structure. The line portion may be provided in the form of a single body or may include two or more portions. In the case where the line portion includes two or more portions, the two or more portions may be provided at different layers and may be connected through a contact hole, which is formed to penetrate an insulating layer therebetween.

FIG. 5A is a sectional view illustrating a portion of the display panel DP corresponding to the transistors T1 and T2 and the organic light-emitting diode OLED. The circuit device layer DP-CL disposed on the base layer BL may include at least one insulating layer and a circuit device. The circuit device may include signal lines and pixel driving circuits, among other circuit components. The formation of the circuit device layer DP-CL may include forming an insulating layer, a semiconductor layer, and a conductive layer using a coating or deposition process and then patterning the insulating layer, the semiconductor layer, and the conductive layer using a photolithography and/or etching process.

In the present embodiment, the circuit device layer DP-CL may include a buffer layer BFL, a first intermediate inorganic layer 10, and a second intermediate inorganic layer 20 formed of inorganic materials. The circuit device layer DP-CL may also include an intermediate organic layer 30, which is formed of organic material. The buffer layer BFL may include a plurality of stacked inorganic layers. FIG. 5A illustrates an example of relative positions of some elements (e.g., a first semiconductor pattern OSP1, a second semiconductor pattern OSP2, a first control electrode GET, a second control electrode GE2, a first input electrode DE1, a first output electrode SE1, a second input electrode DE2, and a second output electrode SE2) constituting switching and driving transistors T1 and T2. First to fourth penetration holes CH1 to CH4 may also be exemplarily illustrated in FIG. 5A.

The display device layer DP-DEL may include an organic light-emitting diode OLED. The display device layer DP-DEL may include a pixel definition layer PDL. For example, the pixel definition layer PDL may be an organic layer.

A first electrode AE may be disposed on the intermediate organic layer 30. The first electrode AE may be connected to the second output electrode SE2 through a fifth through hole CH5 which penetrates the intermediate organic layer 30. An opening OP may be defined in the pixel definition layer PDL. The opening OP of the pixel definition layer PDL may expose at least a portion of the first electrode AE. Hereinafter, the opening OP of the pixel definition layer PDL will be referred to as a light-emitting opening, for a clear distinction from other openings.

As shown in FIG. 5A, the display region DP-DA may include a light-emitting region PXA and a non-light-emitting region NPXA adjacent to the light-emitting region PXA. The non-light-emitting region NPXA may be provided to surround the light-emitting region PXA. In the present embodiment, the light-emitting region PXA may be defined to correspond to a portion of the first electrode AE exposed by the light-emitting opening OP.

The hole control layer HCL may be disposed in common in the light-emitting region PXA and the non-light-emitting region NPXA. The hole control layer HCL may include a hole transport layer and, in an embodiment, the hole control layer HCL may further include a hole injection layer. An emission layer EML may be disposed on the hole control layer HCL. The emission layer EML may be disposed on a region corresponding to the light-emitting opening OP. In other words, the emission layer EML may include a plurality of isolated patterns, each of which is provided for a corresponding one of the pixels. The emission layer EML may be formed of or include an organic material and/or an inorganic material. The emission layer EML may generate light of a specific color.

An electron control layer ECL may be disposed on the emission layer EML. The electron control layer ECL may include an electron transport layer, and in an embodiment, the electron control layer ECL may further include an electron injection layer. The hole control layer HCL and the electron control layer ECL may be formed using an open mask. Therefore, the hole control layer HCL and the electron control layer ECL may be formed in common in a plurality of pixels. A second electrode CE may be disposed on the electron control layer ECL. The second electrode CE may be a single pattern, which is formed in common in a plurality of pixels.

As shown in FIGS. 5A and 5B, the upper insulating layer TFL may be disposed on the second electrode CE. The upper insulating layer TFL may include a plurality of thin films, a capping layer CPL, and a thin encapsulation layer TFE. The thin encapsulation layer TFE may include a first inorganic layer IOL1, an organic layer IOL2, and a second inorganic layer IOL3.

The capping layer CPL may be disposed on the second electrode CE and may be in contact with the second electrode CE. The capping layer CPL may be formed of or include an organic material. The first inorganic layer IOL1 may be disposed on the capping layer CPL and may be in contact with the capping layer CPL. The organic layer IOL2 may be disposed on the first inorganic layer IOL1 and may be in contact with the first inorganic layer IOL1. The second inorganic layer IOL3 may be disposed on the organic layer IOL2 and may be in contact with the organic layer IOL2.

The capping layer CPL may protect the second electrode CE from a subsequent process (e.g., a sputtering process) and may increase the light-emitting efficiency of the organic light-emitting diode OLED. The capping layer CPL may have a refractive index larger than that of the first inorganic layer IOL1.

The first and second inorganic layers IOL1 and IOL3 may protect the display device layer DP-DEL from moisture and/or oxygen. The organic layer IOL2 may protect the display device layer DP-DEL from a contamination material, such as dust particles. Each of the first and second inorganic layers IOL1 and IOL3 may be one of a silicon nitride layer, a silicon oxynitride layer, and a silicon oxide layer. In an embodiment, the first and second inorganic layers IOL1 and IOL3 may include a titanium oxide layer or an aluminum oxide layer. The organic layer IOL2 may include an acrylic organic layer, but the inventive concept is not limited to this example.

In an embodiment, an inorganic layer (e.g., a LiF layer) may be further disposed between the capping layer CPL and the first inorganic layer IOL1. The LiF layer may increase the light-emitting efficiency of the organic light-emitting diode OLED.

Figure 6A:
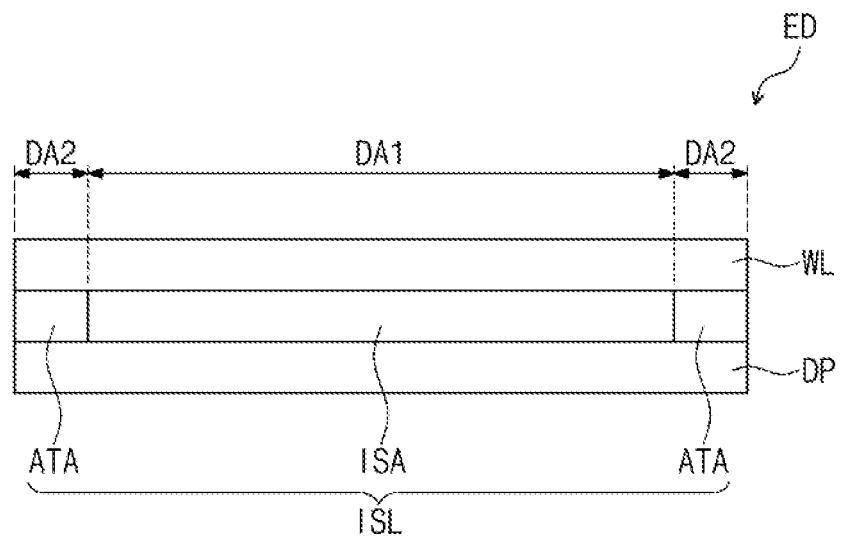
FIG. 6A is a sectional view illustrating an electronic device according to an embodiment of the inventive concept.
Figure 6B:
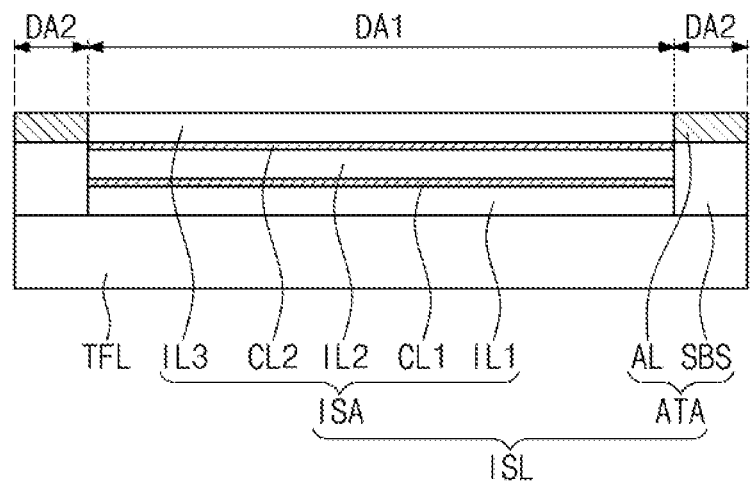
FIG. 6B is a sectional view illustrating an input sensor and antenna according to an embodiment of the inventive concept.

FIG. 6A is a sectional view illustrating an electronic device according to an embodiment of the inventive concept. FIG. 6B is a sectional view illustrating an input sensor and antenna according to an embodiment of the inventive concept.

Referring to FIG. 6A, the electronic device ED may include the display panel DP, the input-sensing layer ISL, and the window layer WL. The input-sensing layer ISL may be disposed on the display panel DP, and the window layer WL may be disposed on the input-sensing layer ISL. The input-sensing layer ISL may include an input sensor region ISA including an input sensor and an antenna region ATA including an antenna. The input sensor region ISA may correspond to the first region DA1, and the antenna region ATA may correspond to the second region DA2. In an embodiment, the input sensor of the input sensor region ISA and the antenna of the antenna region ATA may be spaced apart from each other, when viewed in a plan view.

Referring to FIG. 6B, the input sensor of the input sensor region ISA may include a first insulating layer IL1, a first sensing layer CL1, a second insulating layer IL2, and a second sensing layer CL2 with a plurality of sensor units (not shown). The first sensing layer CL1 may be disposed on the first insulating layer IL1. The second insulating layer IL2 may cover the first sensing layer CL1. The second sensing layer CL2 may be disposed on the second insulating layer IL2. A third insulating layer IL3 may cover the second sensing layer CL2. The antenna of the antenna region ATA may include a base substrate SBS and an antenna layer AL. In an embodiment, the sensor units (not shown) and the antenna may be spaced apart from each other in a thickness direction.

Figure 7A:
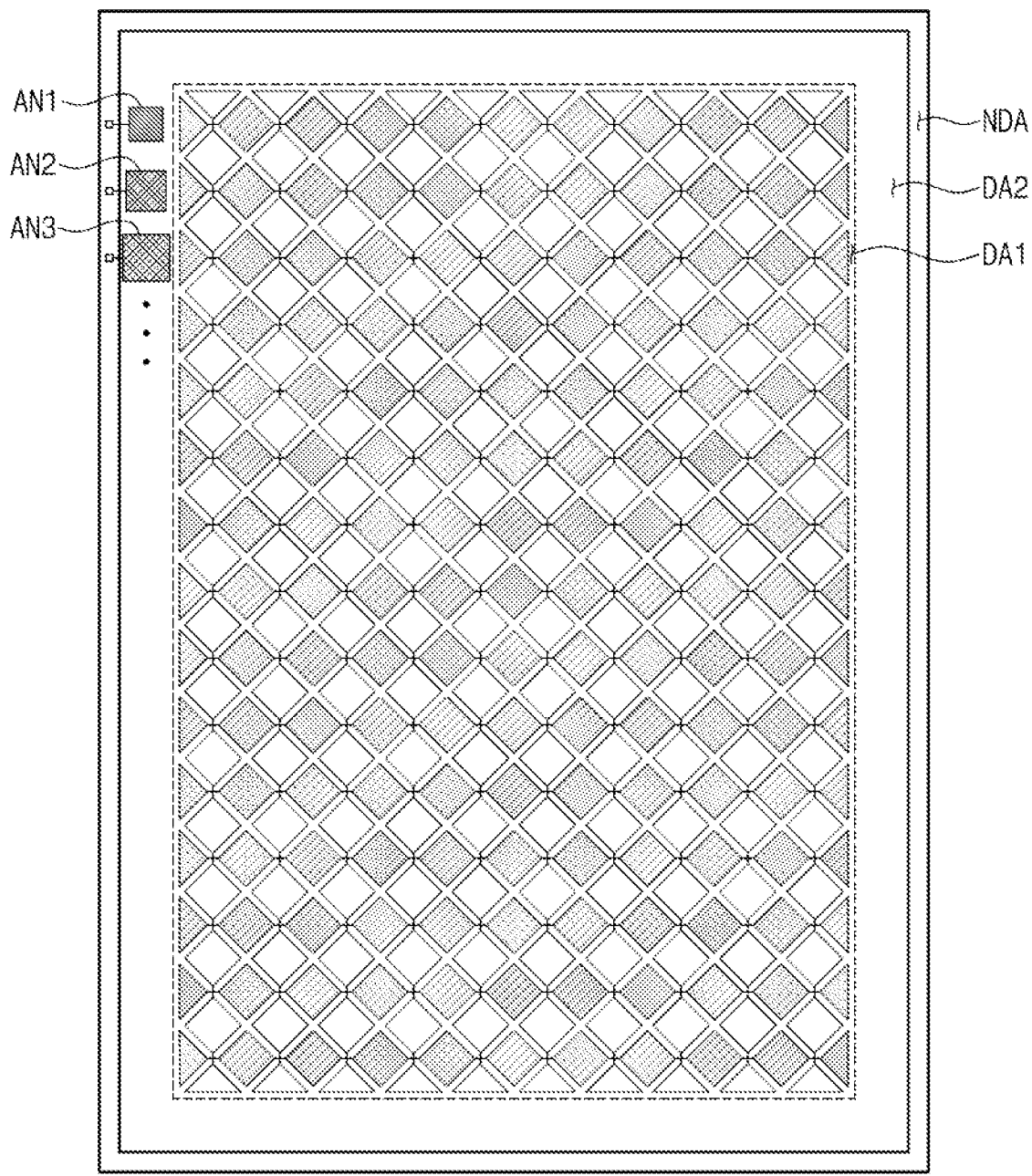
FIG. 7A is a plan view illustrating an electronic device according to an embodiment of the inventive concept.

FIG. 7A is a plan view illustrating an electronic device according to an embodiment of the inventive concept. In an embodiment, the electronic device ED may include a display panel and an input sensor and an antenna, which are disposed on the display panel. Here, the antenna may include a first antenna AN1, a second antenna AN2, and a third antenna AN3. The input sensor may be overlapped with the first region DA1, and the first to third antennas AN1, AN2, and AN3 may be overlapped with the second region DA2.

In an embodiment, the second region DA2 may be an edge region of the display region surrounding the first region DA1. The input sensor in the first region DA1 may be spaced apart from the first to third antennas AN1, AN2, and AN3 in the second region DA2. For example, the input sensor and the first to third antennas AN1, AN2, and AN3 may be spaced apart from each other by a distance of between 0.5 mm to 2 mm.

The first to third antennas AN1, AN2, and AN3 are illustrated in the drawings, but the inventive concept is not limited to this example. For example, besides the first to third antennas AN1, AN2, and AN3, antennas with various sizes and providing different frequency bands may be further provided. Referring to, for example, FIG. 7A, a plurality of antennas, which are stretched in various sizes from the first antenna AN1, may be disposed in a portion of the second region DA2, in which the first to third antennas AN1, AN2, and AN3 are not disposed. In an embodiment, each of the first to third antennas AN1, AN2, and AN3 may be provided in plural in the second region DA2.

The first antenna AN1, the second antenna AN2, and the third antenna AN3 may be spaced apart from each other when viewed in a plan view. For example, the first antenna AN1, the second antenna AN2, and the third antenna AN3 may be spaced apart from each other by a distance of between 30 μm to 50 μm.

Each of the first to third antennas AN1, AN2, and AN3 may include a stretchable pattern. For example, the first to third antennas AN1, AN2, and AN3 may be provided in a mesh shape. In an embodiment, each of the first to third antennas AN1, AN2, and AN3 may include a plurality of stretchable patterns, which are provided to form the mesh shape. That is, the plurality of stretchable patterns may, when taken in the aggregate, form the stretchable pattern of the first to third antennas AN1, AN2, and AN3.

For example, a stretchable pattern may be configured such that it can be initially formed to have a first size (e.g., the size of first antenna AN1), and then stretched to form an antenna of a second size (e.g., the size of the second antenna AN2 or the third antenna AN3). In some cases, stretching the stretchable pattern may cause curved portions of lines forming the stretchable pattern to decrease in curvature and thereby increase in length. This may correspond to an overall increase in the size of the stretchable pattern.

In an embodiment, the first antenna AN1, the second antenna AN2, and the third antenna AN3 may provide frequency bands different from each other. For example, the first antenna AN1 may provide a frequency band of 39 GHz, the second antenna AN2 may provide a frequency band of 28 GHz, and the third antenna AN3 may provide a frequency band of 24 GHz. A size of the first antenna AN1 may be smaller than a size of the second antenna AN2, and the size of the second antenna AN2 may be smaller than a size of the third antenna AN3. Here, the frequency band of each antenna may be inversely proportional to the size of each antenna.

In the present embodiment, the second antenna AN2 and the third antenna AN3 may be formed from the first antenna AN1. The second antenna AN2 and the third antenna AN3 may be formed by stretching the first antenna AN1. This will be described in more detail with reference to FIGS. 8A to 9B.

Figure 7B:
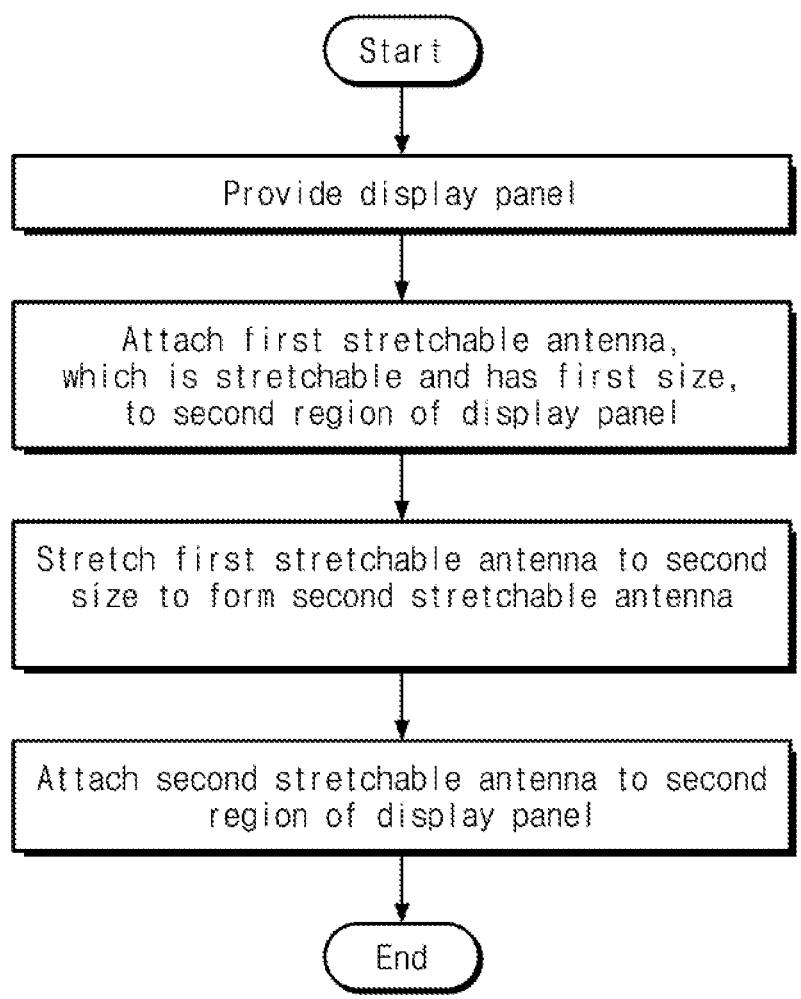
FIG. 7B is a flow chart illustrating a method of fabricating an electronic device, according to an embodiment of the inventive concept.

FIG. 7B is a flow chart illustrating a method of fabricating an electronic device, according to an embodiment of the inventive concept.

Referring to FIG. 7B, a method of fabricating an electronic device may include providing a display panel, attaching a first stretchable antenna to a second region of the display panel, forming a second stretchable antenna from the first stretchable antenna, and attaching the second stretchable antenna to the second region on the display panel.

The display panel may include a display region and a non-display region, and the display region may include a first region and a second region. The second region may correspond to an edge region of the display region enclosing the first region. The first stretchable antenna may have a first size and may be formed of a stretchable material. The attaching of the first stretchable antenna may be performed to attach the first stretchable antenna to the second region. The first stretchable antenna may provide a first frequency band.

The forming of the second stretchable antenna may include stretching the stretchable antenna to a second size larger than the first size and fastening the stretchable antenna in the stretched state. The second stretchable antenna may have the second size and may provide a second frequency band. If the second frequency band is 28 GHz, the second size may be set to realize the second frequency band of 28 GHz, and this may be achieved by stretching and fastening the first stretchable antenna, which has the first size, to the set second size.

In an embodiment, the first stretchable antenna and the second stretchable antenna may include a first stretchable pattern and a second stretchable pattern, respectively. The formation of the second stretchable antenna may include stretching an antenna having the first stretchable pattern. Each of the first and second stretchable patterns may include a curved-line portion. A distance between opposite ends of the curved-line portion of the first stretchable pattern may be smaller than a distance between opposite ends of the curved-line portion of the second stretchable pattern. In an embodiment, the first stretchable pattern may be stretched such that the distance between the opposite ends of the curved-line portion thereof is equal to a distance between the opposite ends of the curved-line portion of the second stretchable pattern. The second stretchable antenna may be formed from the first stretchable antenna in this manner. This will be described in more detail with reference to FIGS. 8A to 10B.

Figure 8A:
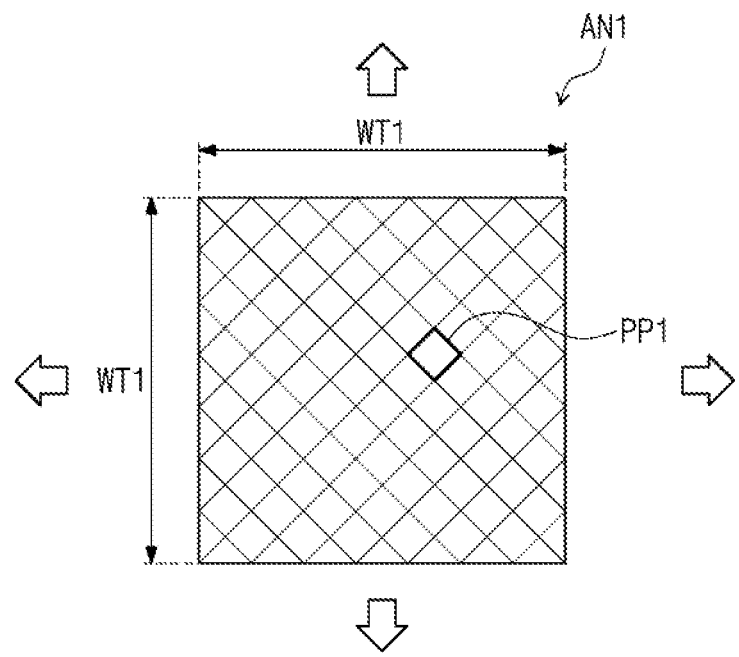
FIGS. 8A to 8C are diagrams, each of which illustrates an antenna according to an embodiment of the inventive concept.
Figure 8B:
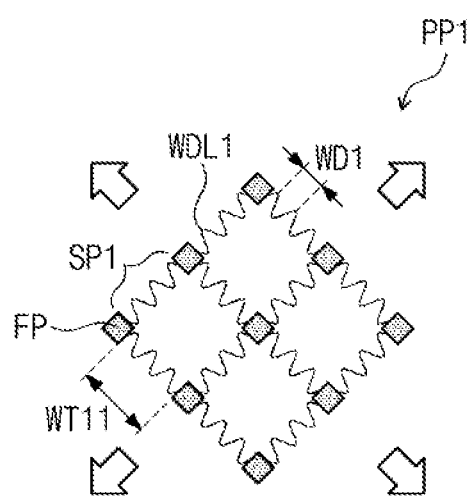
Figure 8C:
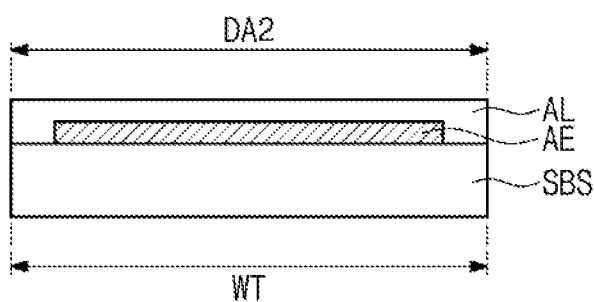
Figure 9A:
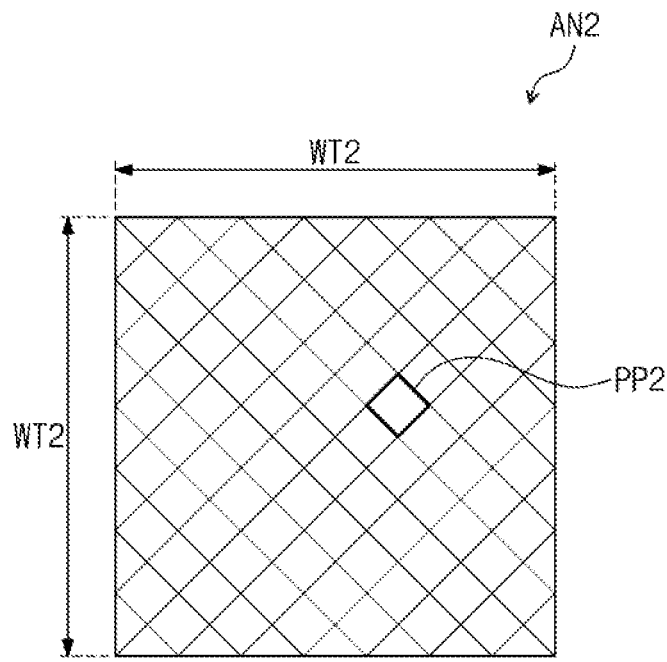
FIGS. 9A and 9B are diagrams, each of which illustrates an antenna according to an embodiment of the inventive concept.
Figure 9B:
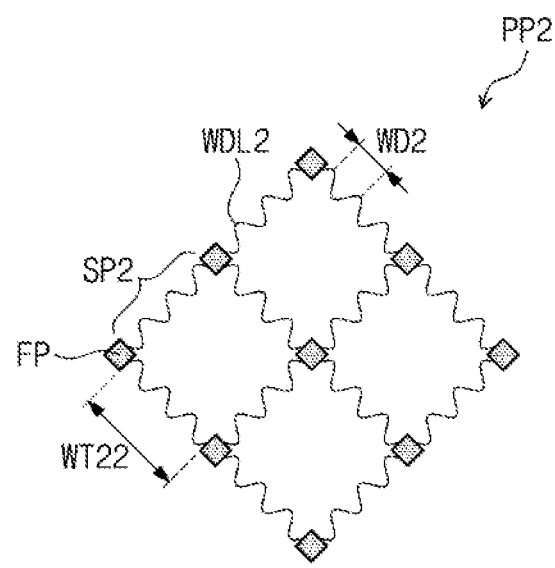
Figure 10A:
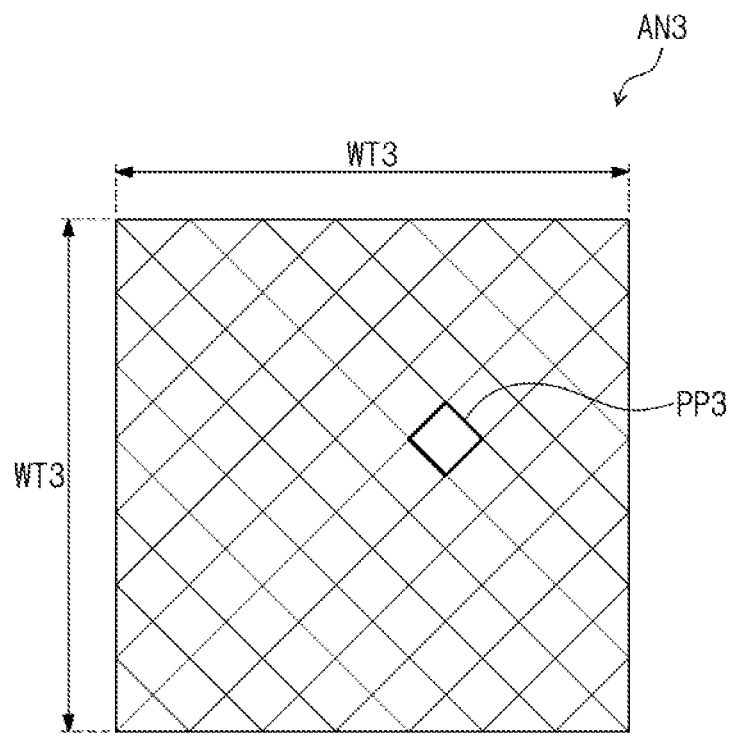
FIGS. 10A and 10B are diagrams, each of which illustrates an antenna according to an embodiment of the inventive concept.
Figure 10B:
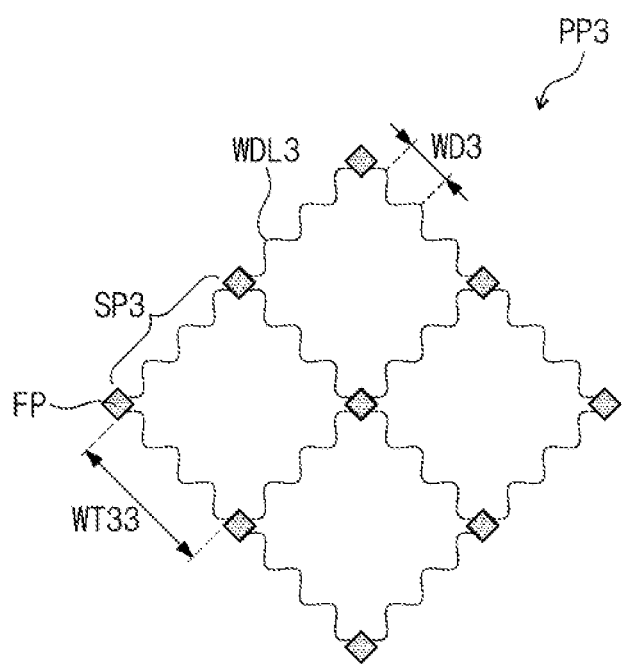

FIGS. 8A to 8C are diagrams, each of which illustrates an antenna according to an embodiment of the inventive concept. FIGS. 9A and 9B are diagrams, each of which illustrates an antenna according to an embodiment of the inventive concept. FIGS. 10A and 10B are diagrams, each of which illustrates an antenna according to an embodiment of the inventive concept.

FIG. 8A is a diagram illustrating an enlarged shape of the first antenna AN1, according to an embodiment of the inventive concept. FIG. 8B is a diagram illustrating an enlarged shape of a first pattern portion PP1 of the first antenna AN1 of FIG. 8A. FIG. 8C is a sectional view illustrating an antenna according to an embodiment of the inventive concept. FIG. 9A is a diagram illustrating an enlarged shape of the second antenna AN2 according to an embodiment of the inventive concept. FIG. 9B is a diagram illustrating an enlarged shape of a second pattern portion PP2 of the second antenna AN2 of FIG. 9A. FIG. 10A is a diagram illustrating an enlarged shape of the third antenna AN3 according to an embodiment of the inventive concept. FIG. 10B is a diagram illustrating an enlarged shape of a third pattern portion PP3 of the third antenna AN3 of FIG. 10A.

Referring to FIG. 8A, the first antenna AN1 may have a mesh shape (or a mesh pattern). The first antenna AN1 may include a plurality of first pattern portions PP1, which define a mesh shape. For example, the first pattern portions PP1 may include a plurality of mesh holes defining the mesh shape.

In an embodiment, the first antenna AN1 may provide a first frequency band. For example, if the first frequency band is 39 GHz, a length WT1 of a side of the first antenna AN1 may correspond to 1.9 mm. The higher the first frequency band, the smaller the length WT1 of the side of the first antenna AN1.

Referring to FIG. 8B, the first pattern portion PP1 may include a first stretchable pattern SP1 and a fastening pattern FP. In an embodiment, the first stretchable pattern SP1 may include a plurality of first stretchable patterns SP1. The fastening pattern FP may fasten opposite ends of at least two the first stretchable patterns SP1. The fastening pattern FP may fasten the first stretchable patterns SP1 and may prevent the first stretchable patterns SP1 from being separated from each other when the first stretchable patterns SP1 are stretched.

The opposite ends of the first stretchable patterns SP1 may be spaced apart from each other by the same distance (e.g., a first distance WT11). The first stretchable pattern SP1 may include a curved-line portion WDL1 including a plurality of curved portions WD1. For example, the first stretchable pattern SP1 may include the curved-line portion WDL1 with three curved portions. The curved portions WD1 of the first stretchable pattern SP1 may have substantially the same width.

Referring to FIG. 8C, the first to third antennas AN1, AN2, and AN3 (e.g., see FIG. 8A) may further include the base substrates SBS, respectively, which are used to support the first to third stretchable patterns SP1, SP2, and SP3 (e.g., see FIGS. 8B, 9B, and 10B). In an embodiment, the first to third antennas may include the antenna layer AL on the base substrate SBS. The antenna layer AL may cover the first electrode AE. The first electrode AE may correspond to the first to third stretchable patterns SP1, SP2, and SP3 of the first to third antennas AN1, AN2, and AN3. The base substrate SBS may be a stretchable film that can be stretched or elongated. The base substrate SBS may be formed of or include, for example, poly dimethylsiloxane (PDMS).

Referring to FIG. 9A, the second antenna AN2 may be formed by stretching an antenna having the size and shape of the first antenna AN1 of FIG. 8A. Thus, the size of the second antenna AN2 may be larger than that of the first antenna AN1. For example, the second antenna AN2 may provide a second frequency band. The second frequency band may be 28 GHz, and a length WT2 of a side of the second antenna AN2 may correspond to 2.6 mm.

The second antenna AN2 may include the second pattern portion PP2. In an embodiment, a plurality of the second pattern portions PP2 defining a mesh shape may be provided. The size of the second pattern portion PP2 may be larger than that of the first pattern portion PP1 of the first antenna AN1. The number of the second pattern portions PP2 may be equal to the number of the first pattern portions PPT.

Referring to FIG. 9B, the second pattern portion PP2 may include the second stretchable pattern SP2 and the fastening pattern FP. The second stretchable pattern SP2 may include a curved-line portion WDL2 including a plurality of curved portions WD2.

Referring to FIG. 10A, the third antenna AN3 may be formed by stretching an antenna having a size and shape of the first antenna AN1 (e.g., see FIG. 8A) or the second antenna AN2 (e.g., see FIG. 9A). The size of the third antenna AN3 may be larger than the size of the second antenna AN2. The third antenna AN3 may provide a third frequency band. In an embodiment, a length WT3 of a side of the third antenna AN3 may be 3.1 mm and the third antenna AN3 may provide a frequency band of 24 GHz.

The third antenna AN3 may have a mesh shape, and the third pattern portion PP3 may define the mesh shape.

Referring to FIG. 10B, the third pattern portion PP3 may include the third stretchable pattern SP3 and the fastening pattern FP. In an embodiment, a plurality of the third stretchable patterns SP3 may be provided. The third stretchable pattern SP3 may include a curved-line portion WDL3 including a plurality of curved portions WD3.

Referring to FIGS. 8A to 10B, the numbers of the first to third pattern portions PP1, PP2, and PP3 may be the same. The size of the first pattern portion PP1 may be smaller than the size of the second pattern portion PP2, and the size of the second pattern portion PP2 may be smaller than the size of the third pattern portion PP3. In an embodiment, the numbers of the first, second, and third stretchable patterns SP1, SP2, and SP3 may be the same. Each of the first to third stretchable patterns SP1, SP2, and SP3 is illustrated to have three curved portions WD1, WD2, or WD3, but the inventive concept is not limited to this example. For example, each of the first to third stretchable patterns SP1, SP2, and SP3 can be provided to have one curved portion or two or more curved portions.

Referring to FIGS. 8A to 10B, the first distance WT11, a second distance WT22, and a third distance WT33 may be different from each other. In an embodiment, the second distance WT22 between the opposite ends of the second stretchable pattern SP2 may be larger than the first distance WT11 between the opposite ends of the first stretchable pattern SP1. The third distance WT33 between the opposite ends of the third stretchable pattern SP3 may be larger than the distance WT22 between the opposite ends of the second stretchable pattern SP2.

Therefore, the first frequency band provided by the first antenna AN1 may be greater than the second frequency band provided by the second antenna AN2. Additionally or alternatively, the second frequency band provided by the second antenna AN2 may be greater than the third frequency band provided by the third antenna AN3.

The numbers of the curved portions WD1, WD2, and WD3, which are provided in the first to third stretchable patterns SP1, SP2, and SP3, may be the same. For example, the numbers of the curved portions in each of the first to third stretchable patterns SP1, SP2, and SP3 may be three, but the disclosure is not limited thereto. In an embodiment, a first width of the curved portion WD1 of the first stretchable pattern SP1 may be smaller than a second width of the curved portion WD2 of the second stretchable pattern SP2. A second width of the curved portion WD2 of the second stretchable pattern SP2 may be smaller than a third width of the curved portion WD3 of the third stretchable pattern SP3.

In an embodiment, stretched lengths of the curved-line portions WDL1, WDL2, and WDL3 of the first to third stretchable patterns SP1, SP2, and SP3 may be the same.

Each of the second and third stretchable patterns SP2 and SP3 may be formed by stretching the first stretchable pattern SP1.

Figure 11:
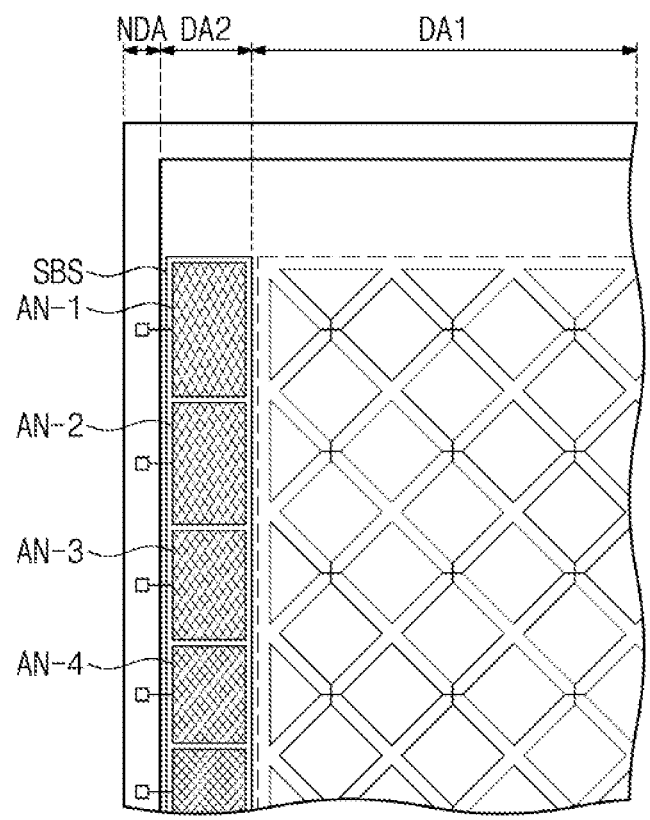
FIG. 11 is a plan view illustrating an electronic device according to an embodiment of the inventive concept.

FIG. 11 is a plan view illustrating an electronic device according to an embodiment of the inventive concept.

In an embodiment, the electronic device may include first to fourth antennas AN-1, AN-2, AN-3, and AN-4, where first to fourth antennas AN-1, AN-2, AN-3, and AN-4 are stretchable. The electronic device may also include base substrate SBS, which supports the first to fourth antennas AN-1, AN-2, AN-3, and AN-4, where base substrate SBS is stretchable. The first to fourth antennas AN-1, AN-2, AN-3, and AN-4 may have different sizes from each other. In an embodiment, when the base substrate SBS is stretched, the first to fourth antennas AN-1, AN-2, AN-3, and AN-4, which are stretchable, may be stretched along with the base substrate SBS. The larger the distance from the center of the stretchable base substrate SBS, the larger the sizes of the first to fourth antennas AN-1, AN-2, AN-3, and AN-4. For example, the size of the first antenna AN-1 may be larger than the sizes of the second to fourth antennas AN-2, AN-3, and AN-4.

The first to fourth antennas AN-1, AN-2, AN-3, and AN-4 may include stretchable patterns, respectively. The stretchable patterns may define a mesh shape. Except for these features, the electronic device, according to the present embodiment, may have the same features as those described with reference to FIGS. 8A to 10B.

Figure 12:
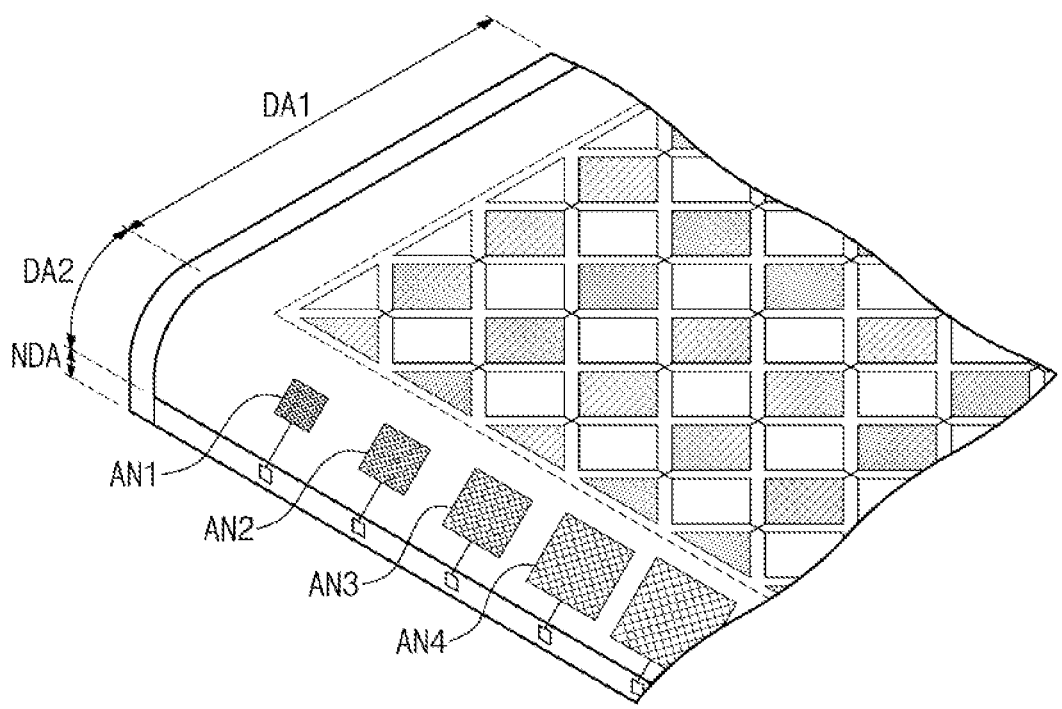
FIG. 12 is a perspective view illustrating an electronic device according to an embodiment of the inventive concept.

FIG. 12 is a perspective view illustrating an electronic device according to an embodiment of the inventive concept.

Referring to FIG. 12, the electronic device may include a bending region and a non-bending region. The first region DA1 of the display panel may include or be overlapped with the non-bending region, and the second region DA2 may include or be overlapped with the bending region. The input sensor may be disposed in the non-bending region. First to fourth antennas AN1, AN2, AN3, and AN4 may be disposed in the bending region. The first to fourth antennas AN1, AN2, AN3, and AN4 disposed in the bending region may be spaced apart from the input sensor. Additionally or alternatively, the first to fourth antennas AN1, AN2, AN3, and AN4 may be spaced apart from each other. In the electronic device shown in FIG. 12, the antenna may be spatially spaced apart from the input sensor (e.g., from a touch pad portion of the display panel). Therefore, a reduction in interference therebetween may be possible.

According to an embodiment of the present disclosure, an electronic device may include a display panel including a display region and a non-display region adjacent to the display region; a first antenna (e.g., first antenna AN1) in a border region of the display region, wherein the first antenna comprises a stretchable pattern having a first size; and a second antenna (e.g., second antenna AN2) in the border region, wherein the second antenna comprises the stretchable pattern stretched to a second size different from the first size.

In an embodiment, the electronic device further comprises a third antenna (e.g., third antenna AN3) in the border region, wherein the third antenna comprises the stretchable pattern stretched to a third size different from the first size and the second size. In an embodiment, the first antenna and the second antenna each comprise a mesh pattern having a same number of holes. In an embodiment, the first antenna and the second antenna are located within a bendable region of the display panel which is spaced apart from a non-bendable region of the display panel that includes an input sensor.

Figure 13A:
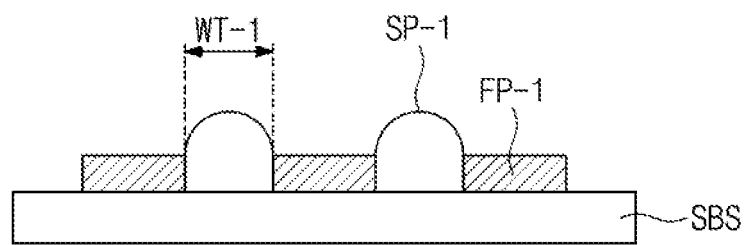
FIGS. 13A and 13B are diagrams, each of which illustrates an antenna according to an embodiment of the inventive concept.
Figure 13B:
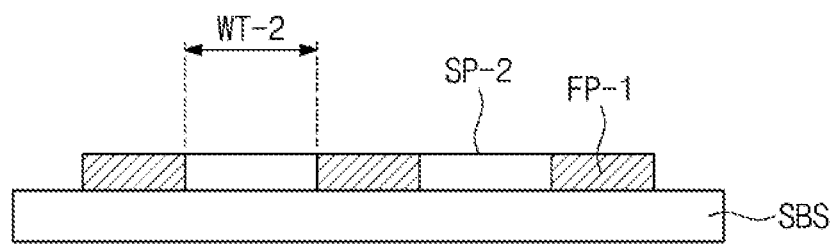

FIGS. 13A and 13B are diagrams, each of which illustrates an antenna according to an embodiment of the inventive concept. FIG. 13A is a diagram illustrating a stretchable first antenna, and FIG. 13B is a diagram illustrating a second antenna stretched from the first antenna.

Referring to FIG. 13A, the first antenna may include a fastening pattern FP-1, a stretchable pattern SP-1, and the base substrate SBS, which supports the fastening pattern FP-1 and the stretchable pattern SP-1. In an embodiment, the stretchable pattern SP-1 may have a curved shape, allowing the stretchable pattern SP-1 to have a protruding shape in a thickness direction of the display panel DP (e.g., see FIG. 6A).

Referring to FIG. 13B, the second antenna may have a shape stretched or elongated from the first antenna. In an embodiment, a width WT-2 of a stretchable pattern SP-2 of the second antenna may be larger than a width WT-1 of the stretchable pattern SP-1 of the first antenna. The stretchable pattern SP-2 of the second antenna may have a curved shape whose width is larger than the width WT-1 of the stretchable pattern SP-1 of the first antenna, and the stretchable pattern SP-2 of the second antenna may have a linear shape, as shown in the drawings.

According to an embodiment of the inventive concept, the electronic device may include a plurality of antennas with stretchable patterns. The stretchable pattern may be provided to define a mesh shape and may be freely stretched to provide antennas of different sizes. Owing to the stretchable property of the stretchable pattern, antennas, which have various sizes and provide various frequency bandwidths, may be provided in the electronic device. Therefore, there is no need to design a plurality of antennas providing various frequency bands.

While example embodiments of the inventive concept have been particularly shown and described, it will be understood by one of ordinary skill in the art that variations in form and detail may be made therein without departing from the spirit and scope of the attached claims.

What is claimed is:

1. An electronic device, comprising
a display panel including a display region and a non-display region adjacent to the display region; and
a first antenna and a second antenna, which are disposed on the display panel and are overlapped with the display region, wherein each of the first antenna and the second antenna includes a stretchable pattern,
wherein a first distance between opposite ends of the stretchable pattern of the first antenna is different from a second distance between opposite ends of the stretchable pattern of the second antenna, and wherein the first antenna and the second antenna each have a mesh shape with the stretchable pattern, the stretchable pattern includes a plurality of stretchable patterns, the mesh shape is defined by the plurality of stretchable patterns, a number of stretchable patterns in the mesh shape of the first antenna is equal to a number of stretchable patterns in the mesh shape of the second antenna, and each of the plurality of stretchable patterns of the second antenna is stretched to a larger size than the plurality of stretchable patterns of the first antenna on the display panel.

2. The electronic device of claim 1, wherein a second region within the display region that overlaps the first antenna and the second antenna corresponds to an edge of the display region enclosing a first region that includes an input sensor.

3. The electronic device of claim 1, wherein the first antenna and the second antenna are configured to provide a first frequency band and a second frequency band different from the first frequency band, respectively,
- wherein when the first distance is larger than the second distance, the first frequency band is smaller than the second frequency band, and
- when the first distance is smaller than the second distance, the first frequency band is larger than the second frequency band.

4. The electronic device of claim 1, wherein the first antenna is spaced apart from the second antenna, when viewed in a plan view.

5. The electronic device of claim 1, wherein the first antenna and the second antenna each further comprises fastening patterns which fasten opposite ends of at least two stretchable patterns of the plurality of stretchable patterns.

6. The electronic device of claim 1, wherein the stretchable pattern includes a curved-line portion including a plurality of curved portions, and the plurality of curved portions have a same width.

7. The electronic device of claim 6, wherein a first width of each of the curved portions of the stretchable pattern within the first antenna is different from a second width of each of the curved portions of the stretchable pattern within the second antenna.

8. The electronic device of claim 6, wherein a stretched length of the curved-line portion of the stretchable pattern within the first antenna is equal to a stretched length of the curved-line portion of the stretchable pattern within the second antenna.

9. The electronic device of claim 1, wherein the stretchable pattern has a curved shape, and protrudes in a direction of the thickness of the display panel.

10. The electronic device of claim 1, wherein each of the first antenna and the second antenna further comprises a base substrate supporting the stretchable pattern.

11. The electronic device of claim 1, further comprising:
an input sensor, wherein the input sensor comprises:
- a first insulating layer;
- a first sensing layer disposed on the first insulating layer;
- a second insulating layer covering the first sensing layer; and
- a second sensing layer disposed on the second insulating layer, wherein the second sensing layer comprises a plurality of sensor units, which are spaced apart from the first and second antennas in a thickness direction.

12. An electronic device, comprising
a display panel including a display region and a non-display region adjacent to the display region;
an input sensor disposed on the display panel and overlapped with a first region of the display region; and
a first antenna and a second antenna, which are disposed on the display panel and are overlapped with a second region of the display region, wherein each of the first antenna and the second antenna includes a mesh pattern, wherein the mesh pattern of the first antenna comprises a first pattern portion with a first size,
the mesh pattern of the second antenna comprises a second pattern portion with a second size different from the first size, and
wherein the first antenna and the second antenna each has a mesh shape with a stretchable pattern, the stretchable pattern includes a plurality of stretchable patterns, and the mesh shape is defined by the plurality of stretchable patterns, a number of stretchable patterns in the mesh shape of the first antenna is equal to a number of stretchable patterns in the mesh shape of the second antenna, and each of the plurality of stretchable patterns of the second antenna is stretched to a larger size than the plurality of stretchable patterns of the first antenna on the display panel.

13. The electronic device of claim 12, wherein each of the first pattern portion and the second pattern portion comprises a plurality of stretchable patterns, each of which has a curved-line portion.

14. The electronic device of claim 13, wherein the curved-line portion comprises a plurality of curved portions, and
a number of the curved portions of the first pattern portion is equal to a number of the curved portions of the second pattern portion.

15. The electronic device of claim 14, wherein a first width of each of the curved portions of the first pattern portion is smaller than a second width of each of the curved portions of the second pattern portion.

16. The electronic device of claim 12, further comprising a base substrate, which supports the first and second antennas and is stretchable.

17. A method of fabricating an electronic device, comprising
providing a display panel including a display region, in which a first region and a second region enclosing the first region are defined, and a non-display region, which is adjacent to the display region;
providing a first stretchable antenna having a first antenna size and a first mesh size and a second stretchable antenna having the first mesh size and the first antenna size;
attaching the first stretchable antenna to the second region of the display panel such that the first stretchable antenna retains the first mesh size and the first antenna size;
stretching the second stretchable antenna from the first size of the first stretchable antenna to obtain a second antenna size different from the first antenna size and a second mesh size different from the first mesh size; and
attaching the stretched second stretchable antenna to the second region of the display panel such that the stretched second stretchable antenna retains the second antenna size different from the first antenna size and the second mesh size different from the first mesh size.

18. The method of claim 17, wherein the first stretchable antenna and the second stretchable antenna comprise a first stretchable pattern and a second stretchable pattern, respectively, and the forming of the second stretchable antenna comprises stretching the first stretchable pattern to form the second stretchable pattern.

\* \* \* \* \*